(12) United States Patent
Scheffer et al.

(10) Patent No.: US 7,024,638 B2
(45) Date of Patent: Apr. 4, 2006

(54) METHOD FOR CREATING PATTERNS FOR PRODUCING INTEGRATED CIRCUITS

(75) Inventors: Louis K. Scheffer, Campbell, CA (US); Kenji Yoshida, Holzkirchen (JP); Yoshikuni Abe, Kanagawa (JP); Aki Fujimura, Saratoga, CA (US); Robert C. Pack, Foster City, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 113 days.

(21) Appl. No.: 10/621,114

(22) Filed: Jul. 14, 2003

(65) Prior Publication Data

US 2005/0015739 A1 Jan. 20, 2005

(51) Int. Cl.
*G06F 17/50* (2006.01)

(52) U.S. Cl. .............. 716/2; 716/19; 716/20; 716/21

(58) Field of Classification Search .............. 716/7–11, 716/19–21, 2; 430/30
See application file for complete search history.

(56) References Cited

U.S. PATENT DOCUMENTS

| | | | | |
|---|---|---|---|---|
| 5,553,273 A * | 9/1996 | Liebmann | ............ | 716/21 |
| 5,553,274 A * | 9/1996 | Liebmann | ............ | 716/21 |
| 5,567,550 A | 10/1996 | Smayling | | |
| 5,580,687 A | 12/1996 | Leedy | | |
| 5,740,068 A * | 4/1998 | Liebmann et al. | ............ | 716/21 |
| 5,821,014 A | 10/1998 | Chen et al. | | |
| 5,879,868 A | 3/1999 | Starikoy et al. | | |
| 5,932,377 A | 8/1999 | Ferguson et al. | | |
| 6,051,347 A * | 4/2000 | Tzu et al. | ............ | 430/30 |
| 6,168,891 B1 * | 1/2001 | Shibata | ............ | 430/30 |
| 6,282,696 B1 * | 8/2001 | Garza et al. | ............ | 716/19 |
| 6,285,488 B1 * | 9/2001 | Sandstrom | ............ | 359/290 |
| 6,421,820 B1 | 7/2002 | Mansfield et al. | | |
| 6,456,899 B1 | 9/2002 | Gleason et al. | | |
| 6,529,621 B1 | 3/2003 | Glasser et al. | | |
| 6,535,774 B1 | 3/2003 | Bode et al. | | |
| 6,560,766 B1 | 5/2003 | Pierrat et al. | | |
| 6,571,383 B1 | 5/2003 | Butt et al. | | |
| 6,578,188 B1 * | 6/2003 | Pang et al. | ............ | 716/19 |
| 6,579,651 B1 | 6/2003 | Subramanian et al. | | |
| 6,634,018 B1 | 10/2003 | Randall et al. | | |
| 6,658,640 B1 * | 12/2003 | Weed | ............ | 716/19 |
| 6,670,082 B1 | 12/2003 | Liu et al. | | |
| 6,703,167 B1 | 3/2004 | LaCour | | |
| 6,787,271 B1 | 9/2004 | Cote et al. | | |
| 2002/0026626 A1 | 2/2002 | Randall et al. | | |
| 2002/0102476 A1 | 8/2002 | Hayano et al. | | |
| 2002/0155357 A1 | 10/2002 | LaCour | | |

(Continued)

OTHER PUBLICATIONS

Liebmann, LW. et al., "TCAD Development for Lithography Resolution Enhancement", IBM Journal of Research and Development, vol. 45, No. 5, Sep. 2001.

(Continued)

*Primary Examiner*—Matthew Smith
*Assistant Examiner*—Naum Levin
(74) *Attorney, Agent, or Firm*—Bingham McCutchen LLP

(57) ABSTRACT

To increase the writing speed of masks, context information can be used to distinguish the attributes of portions of the mask that are critical from attributes, and portions, that are less critical. By using this information, which may be derived from the design context of the features, the mask can be written at a higher speed without sacrificing the accuracy of the important attributes or features.

34 Claims, 11 Drawing Sheets

U.S. PATENT DOCUMENTS

| | | |
|---|---|---|
| 2002/0157068 A1 | 10/2002 | LaCour et al. |
| 2002/0160281 A1 | 10/2002 | Subramanian et al. |
| 2003/0018948 A1 | 1/2003 | Chang et al. |
| 2003/0023939 A1 | 1/2003 | Pierrat et al. |
| 2003/0160980 A1* | 8/2003 | Olsson et al. .............. 358/1.9 |
| 2003/0165749 A1 | 9/2003 | Fritze et al. |
| 2003/0200523 A1 | 10/2003 | Takahashi et al. |
| 2004/0013952 A1 | 1/2004 | Elian et al. |
| 2004/0044984 A1 | 3/2004 | Keogan et al. |
| 2004/0067423 A1 | 4/2004 | Chen et al. |
| 2004/0107412 A1* | 6/2004 | Pack et al. ................. 716/19 |
| 2004/0133369 A1* | 7/2004 | Pack et al. ................. 702/59 |
| 2004/0172610 A1* | 9/2004 | Liebmann et al. ............ 716/19 |

OTHER PUBLICATIONS

Wong, Alfred K., "Resolution Enhancement Techniques in Optical Lithography", SPIE Press, 2001, Chapter 1.

Goering, R. "SEMI's Oasis provides respite from GDSII", *EE Times* Oct. 1, 2002.

Pack, R.C. et al., "GDS-3 Initiative: Advanced Design-through-Chip Infrastructure for Sub-Wavelength Technology", Proceedings of SPIE, vol. 4692, 2002, pp. 566-584.

* cited by examiner

US 7,024,638 B2

METHOD FOR CREATING PATTERNS FOR PRODUCING INTEGRATED CIRCUITS

FIELD OF THE INVENTION

The invention is related to the field of mask writing and mask inspection for integrated circuits.

BACKGROUND OF THE INVENTION

The process of manufacturing integrated circuits uses masks to create the circuit on silicon. The masks are only created once for each chip design, but must be highly accurate. Traditional mask writing methods typically offer a tradeoff between speed and accuracy. The process of manufacturing the mask usually employs techniques that give the highest possible accuracy, at the cost of slower mask creation. Techniques that allow faster mask creation are often less useful since they result in significantly less accurate masks.

For example, multi-pass writing is a technique commonly used in the generation of IC masks to get higher accuracy at the cost of writing time. This technique averages out the errors made in writing each figure. A typical mask writing machine, such as the Toshiba/NuFlare EBM-4000, only reaches its specified accuracy when the writing is done in 4 independent passes. Typically 4 pass writing is twice as accurate as single pass writing due to the statistical averaging of errors (in this case the error goes down as the square root of the number of passes). However, 4 pass writing takes longer (almost 4 times as long) to write a mask. Raster-based machines offer similar tradeoffs, with large spots yielding faster writing but less accuracy, and small spots giving the best accuracy but the longest writing times.

This extra time translates directly to mask cost. In the past, this tradeoff was acceptable since mask cost was not (in general) a significant expense compared to other project expenses. As the number of features on a chip, and their required accuracy, increases, the mask costs are becoming very significant indeed. A way to write the masks faster would be very useful in reducing the costs. Currently, however, conventional methods of doing this require relaxing the accuracy requirement, resulting in a mask that is less accurate. The resulting chip has a lower yield, and hence is not desirable. In conventional approaches, either all features were written to a single accuracy standard which resulted in a slower writing process, or a special database had to be provided to specify which items were more or less critical, but not why, thus limiting possible optimizations.

So currently customers using this approach select between fast writing, which gives lower mask costs, but also lower yield production, and slow mask writing, which gives the best possible yield but at the cost of very slow to produce and expensive masks.

Another approach uses a device for coupling design intent and OPC (Optical Proximity Correction). The design intent is used to write fewer mask features, with the same overall goal of minimizing mask cost. These proposals concentrate on writing fewer figures and do not consider the possibility of writing the same number of mask features, but writing the less-critical features with a faster but less accurate method.

SUMMARY OF THE INVENTION

To increase the yield of the chips produced by a mask, context information can be used to distinguish portions of the mask that are critical from portions that are less critical. By using this information, which may be derived from the design context of the features, the important features may be written with a higher accuracy than the less critical features, without reducing the writing speed of the critical features. Alternatively, the critical parts may be written with methods assuring adequate accuracy, which may be slower than the lower accuracy writing processes used to write the less critical features.

The determination of which features are critical, and the manner in which they are critical, may be made by a process that evaluates design context in light of one or more design parameters. In some cases, the determination may be implied by semiconductor processing. For example, when writing a polysilicon mask, the accuracy of the width may be much more important than the accuracy of the spacing between two features. In general, the information used to determine which aspects of which features are critical reflects the context of the features within the design.

DETAILED DESCRIPTION

Figure 1:
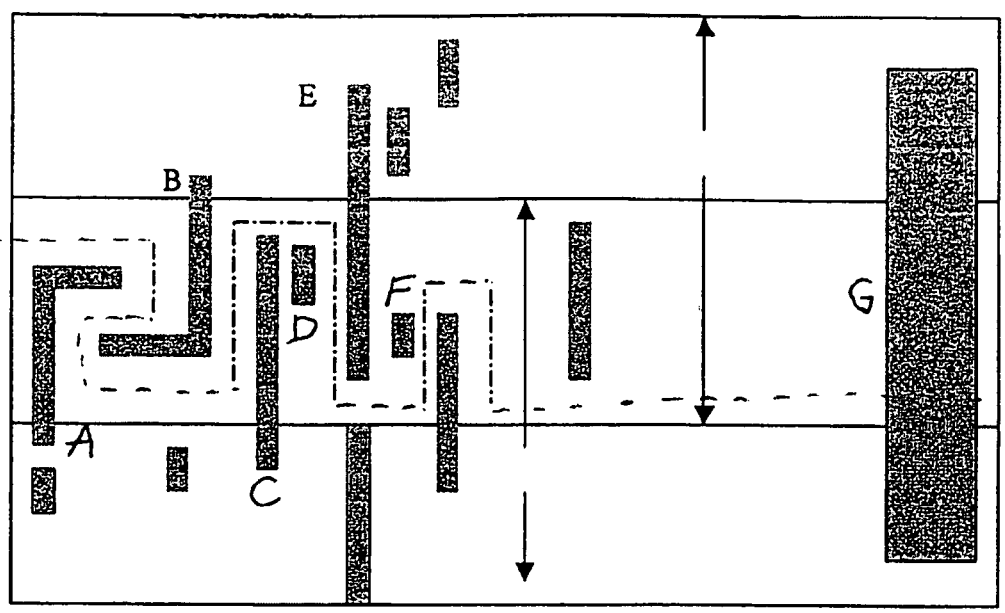
FIG. 1 shows an example of a multi-pass writing strategy based on context information.

Using context information to perform mask writing can improve both the speed and the accuracy of the mask writing process. Design information and context information generated from the design information (such as, for example, timing, critical paths, and polygon data) may be used to perform an analysis of the context of design features to identify critical features of the design. Using the critical feature data, mask writing can be optimized so that certain places of the mask are written with a high accuracy writing process, and other places of the mask are written with a process that is optimized for writing speed. Providing multiple writing processes to be used when writing different portions of the mask reduces the overall cost of each mask.

The context information used for determining the relative importance of design features to select one of the multiple writing processes can include explicit information about the designer's intent (for example, the designer can state which parts are most critical), or it can be derived from characteristics of the design. For example, in a design layout, the size of a polygon in layer polysilicon may be very critical, because the size defines a transistor's dimensions. The spacing between polygons may be less critical. Likewise, even within a single polysilicon figure, the part that defines the gate (overlays the diffusion) may be the most critical, and the rest of the polygon may be less so. These forms of design context can be derived by examining combinations of layers of the integrated circuit (IC) to deduce which polygons, and portions of polygons, are critical.

Examples of information to provide design context for one or more design features include data about neighboring geometries of a feature, the electrical intent of the feature, the timing of the intended circuit that includes the feature, and any possible redundancies or relationships of the feature with neighboring features, for example. The context information allows the importance of a particular feature relative to other features of the design to be determined based on factors such as why the feature is located in a particular place within the design, what the intended use of the feature is within the design, and electrical requirements of the feature within the design. Given the relative importance of the feature, appropriate writing and inspecting processes may be selected, so that the feature is written and inspected with a desired level of accuracy.

A method of understanding the purpose and circumstances of each figure to be written (the context), a model of the operation of the mask (or wafer) writing machine, and, if desired, interaction with the user, provides a way to determine a better tradeoff between speed and accuracy in writing masks or wafers. For example, if the context is writing small features where accurate width is more important than accurate spacing, the method may perform the mask writing so that it occurs in stripes to write masks (or wafers) more quickly.

In an embodiment, if portions of features are to be written to greater accuracy than the figure as a whole, and the accuracy for each portion is determined by design context, then the mask writing can occur in stripes, and user input may or may not be used to establish context, or part of the context. The result may be faster mask writing with accuracy commensurate with the requirements of each portion of each figure.

In one embodiment, the user defines an arbitrary layout. A computer implemented process uses a model of the mask writing process to determine how fast the mask can be written. The computer implemented process presents the mask writing time, and graphical information showing which features forced slower writing, if any, were found. The user, if not satisfied, can interact with the context information to change the design to obtain a more preferred tradeoff between accuracy achieved and mask (or wafer) writing time. One example of the user interaction with the context information is by lines separating regions. Many other equivalent ideas could be used in place of lines. For example, the regions could be different colors or different fill patterns, blink at different rates, or blink when the cursor moves over them.

In an embodiment, a display system, such as a floorplanner for example, shows graphical information, which if followed by the user, results in the highest speed of mask writing. Then the user, if they desire, follow this information to ensure that their design can in fact be written as fast as possible. The display system could also be any graphical layout tool, such as a layout editor, a wiring editor for a place and route tool, for example.

Often the user has in mind a desired pattern on the final wafer. However, since the printing process is not perfect, the computer often adds additional features, not explicitly requested by the user, to make the final printed result more closely resemble the user's desired pattern. These additional features are called RET or Resolution Enhancement Technology features. Two examples of ways this may be done include adding correction features, e.g., features to provide the best possible correction, to the design features (which may result in un-needed writing time) or to minimize the number of added features (or minimize a related quantity called 'shot count'). This optimization for writing accuracy may result in slower mask writing and/or poorer than desired accuracy. (It is entirely possible, for example, than two RET objects related to a single user-defined feature could be written in different stripes, thus incurring a significant amount of error.) Using context information (such as, for example, that several features may be RET enhancements for a single user-defined feature), and information of the characteristics of the mask writing machine, the process can (for example) make sure that each user-defined feature, and its related RET features, are written together in one stripe.

Furthermore, each feature can (in general) be RET corrected in many ways. Using knowledge of the mask writing process, a specific RET correction can be determined based upon the speed (and possibly accuracy) of writing. For example, if the desired accuracy of each piece is computed from context, a computer processing system may have a model of the mask writing process, and a computer program stored in a computer readable memory is executed by the computer processing system to modify the layout of the chip to achieve a fast mask writing time. In one embodiment, cells are in rows, and the computer implemented process determines the position of the rows to optimize the mask writing time. In another embodiment, the context is writing RET (Resolution Enhancement technology) features. The computer system stores a model of the mask writing process, and the computer systems executes a process to choose OPC (Optical Proximity Correction) features to be written based on mask writing speed and accuracy.

In an embodiment a multi-pass writing strategy uses context information, as shown with reference to FIG. 1. The context information, or design intent information, can be used to increase the speed and accuracy of the mask writing process. In one embodiment, the critical features, which may be elements A and B for example, are identified as critical. If increasing the number of passes of a writing process increases the writing accuracy, then the critical features may be written by a process that includes multiple writing passes. Since the critical features may be only a small fraction of the total mask, this writing process may be much faster than writing the whole mask in multi-pass mode. The remaining less critical features can be written in a mode having fewer passes, such as one pass for example. Depending on several factors, such as the density of critical features and the relative speeds of the two modes, the speed of the writing process is increased by reducing the number of passes for writing non-critical features.

Another example of a context based approach recognizes that single pass writing provides adequate accuracy in many places (e.g., in the middle of stripes), but poor accuracy in others (e.g., when a feature is split across a stripe boundary).

Current techniques are unable to analyze context information to determine which features are critical and which aspects of the features are critical. Therefore, current techniques typically use a high accuracy process for a feature that is difficult to write accurately, such as a feature crossing a stripe boundary, for example. However, when an analysis of context information is used to identify which parts of the mask are critical, the critical parts of the chip may be written in a single pass mode by containing the critical parts of the features within the boundaries of a stripe. The dotted line shown in FIG. 1 represents the boundary between the first and second stripes, such that each feature is contained within one of the stripes.

The context based approach of containing each critical feature within a stripe avoids boundary errors that may affect yield or performance. Also, this approach allows masks written in a single pass writing process to have the same yield as masks currently written using multi-pass techniques. For example, mask writing errors may have several components (e.g., sub-field registration errors, stripe registration errors, and random errors). For example, a large portion of a mask writing error budget may be allocated for stripe to stripe registration, which is used to maintain full accuracy for features that cross stripe boundaries. Therefore, the accuracy of a feature contained fully within a stripe, and written with one pass, is comparable to the accuracy a stripe-crossing feature written with multiple passes.

Because critical polygons may be small compared to the scan overlap of stripes 1 and 2, the writing process can create a scan boundary to prevent each polygon from crossing a scan boundary. For example, the dotted line of FIG. 1 is drawn across the chip so that it does not hit any polygons and remains within the scan boundary. In this figure, polygons A, C and D are written as part of the lower stripe, since they fall below the line. Polygons B, E and F are written as part of the upper stripe. Polygon G, a large non-critical polygon, is bigger than the stripe overlap. Therefore it is broken into multiple parts, so that portions of the polygon are written in each strip. With this method, a distinction of individual critical regions within polygons may not be required to ensure the accuracy of the critical regions. As a further advantage, faster mask writing can reduce some types of errors, such as those due to long term drift and chemical instability.

In another example of a context based approach of mask writing using context information, some features cross stripe boundaries. Therefore some parts of some features may be written with poor accuracy. With an understanding of which portions of which polygons are important, the context information can be used to distinguish features that are written with high tolerance from features written with a lower tolerance. The important features of a polygon may be placed within the boundaries of a stripe, so that they may be written with a high accuracy single pass process. The less important features may cross a stripe boundary. The less important features may also be written with a single pass process to increase the speed of the writing process. However, these written features may be less accurate than the important features if these less important features cross a boundary between stripes.

Figure 2:
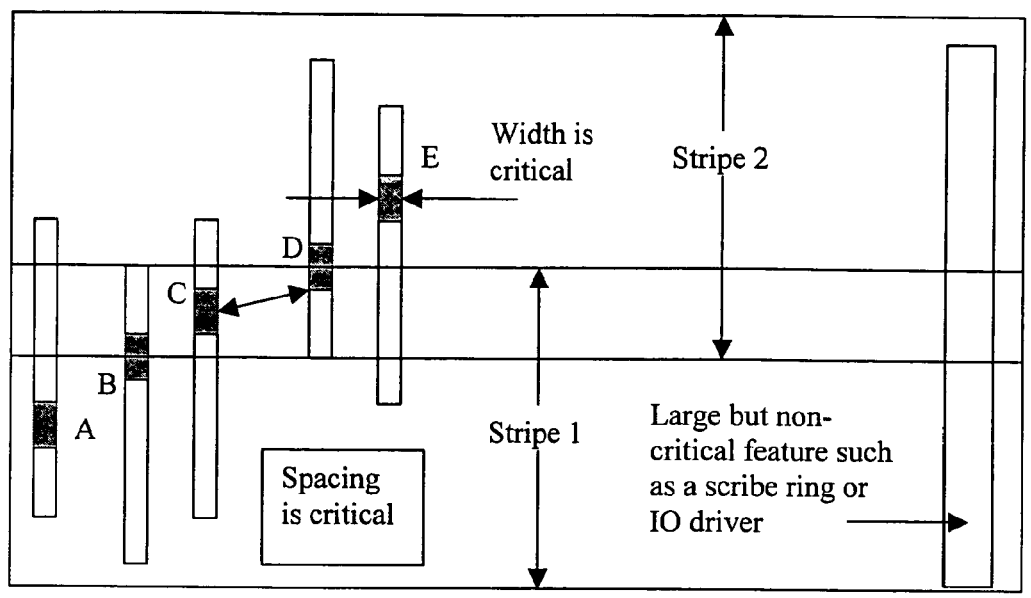
FIG. 2 shows an example of parts of polygons identified as critical based on context information.

For example, consider a polysilicon mask for an Integrated Circuit (IC) as shown in FIG. 2. The polysilicon is used to perform several functions—e.g., to form connection to contacts, create interconnect, form gates, or extend past gates to prevent shorts. The area over the gate is written so that the gate and the smallest transistors are written with tight tolerances, as shown by elements A through E. (Furthermore, even among the smallest transistors, a subset of these transistors may be identified as more important to the functioning of the circuit than the others, and this subset may be written with higher accuracy than the rest of the smallest transistors). Therefore although some poly features (such as IO drivers and/or scribe rings, for example) may extend across stripes, an analysis of context information can be used ensure that no logic gate area is written across a stripe boundary (or, at least no gate area that is critical to circuit operation) by using the context information to identify logic gate areas (or critical logic gate areas) and to place them within boundaries of one stripe.

FIG. 2 shows an example of parts of each polygon identified as critical based on an analysis of context information. The information may also describe why each feature is critical. For example, assume that the shaded elements A, B, C, D, and E each represent the portions of the mask that are to be written to a high accuracy. The high-accuracy writing process is used to ensure that the critical feature, e.g. the actual width, is as close as possible to the design width. However, the spacing between features may be relatively unimportant. In this case, each critical portion of each polygon may be written in one stripe, and each non-critical portion may be written in two stripes. Therefore, even if a polygon crosses a stripe boundary, the important portions of the polygon may be written entirely in one stripe, to ensure their accuracy.

In the example of FIG. 2, the areas A and B are written in stripe 1. The portions D and E are written in stripe 2. The portion C can be written in either stripe, as can the remaining parts of each polygon, which do not require as much accuracy. The large feature of FIG. 2 (shown as the I/O driver, or scribe ring) may necessarily have places where it has the full stripe-to-stripe error. This may be acceptable since such large features do not (in general) have critical dimensions and can be written with lower tolerances.

Additional context information can also be used in the writing process. For example, if the spacing between B and C is critical, or if devices B and C are to be matched as closely as possible, then C should be written in the bottom stripe. On the other hand, if the spacing between C and D is critical, or if C and D are to be as closely matched as possible, then C should be written as part of the top stripe. Thus, the attributes that are used for identifying critical areas may be selected from the design context. This shows an example of the concept that the particular attributes used to identify important areas may differ. For example, some areas are critical in terms of area, some in terms of width, some for their length, some for a mean expected error, and some for matching another area.

Figure 3:
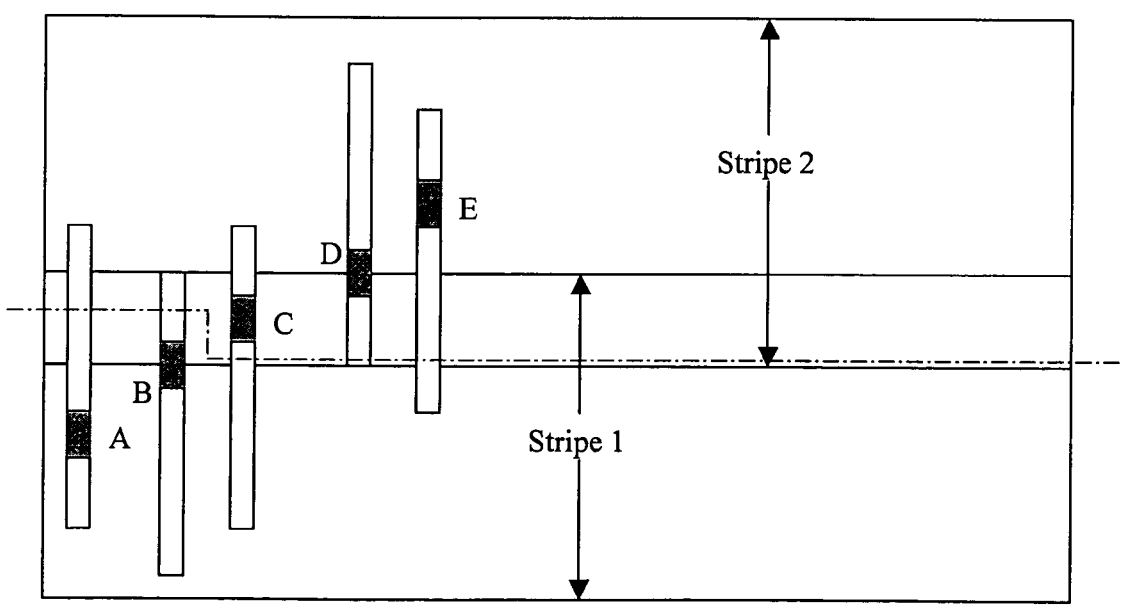
FIG. 3 shows an example of assigning critical regions to one stripe based on context information.

In general, this process may be used by drawing a line across the whole chip, within the stripe overlap, which avoids the critical regions. Then, each critical region may be assigned to one stripe or another, as shown in FIG. 3.

Figure 4:
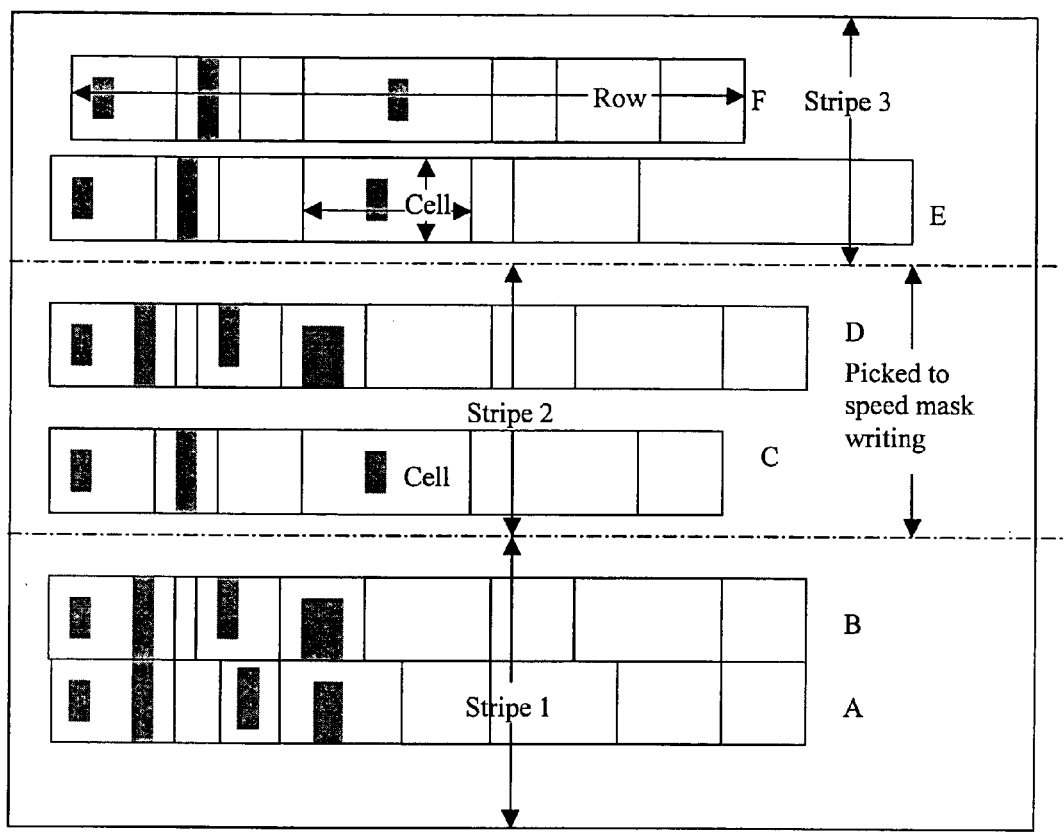
FIG. 4 shows an example of critical features placed at locations selected with context information which are suitable for increasing the speed of mask writing.

In another embodiment of a faster writing process generated with context information, designers could help the mask making process by ensuring that no critical features crosses a straight horizontal line at locations suitable for the mask writing machine, as shown in FIG. 4. Then the mask can be written at an even higher speed since no stripe overlap occurs. In a standard cell methodology, this could be provided by making sure no row lies atop certain horizontal lines (however, the lines may be defined by the capabilities of the mask making machine). The cells and/or rows within each stripe can be evenly or unevenly spaced in the vertical, or Y, dimension, have different lengths, and have different heights, for example.

The process increases the writing speed because each cell and row avoids the pre-defined dotted lines as shown in FIG. 4. Also, this process may be performed automatically, using a computer analysis method to locate critical features using context information, and to place the critical features within the boundaries of a stripe, so that no critical feature crosses a stripe boundary.

Figure 5:
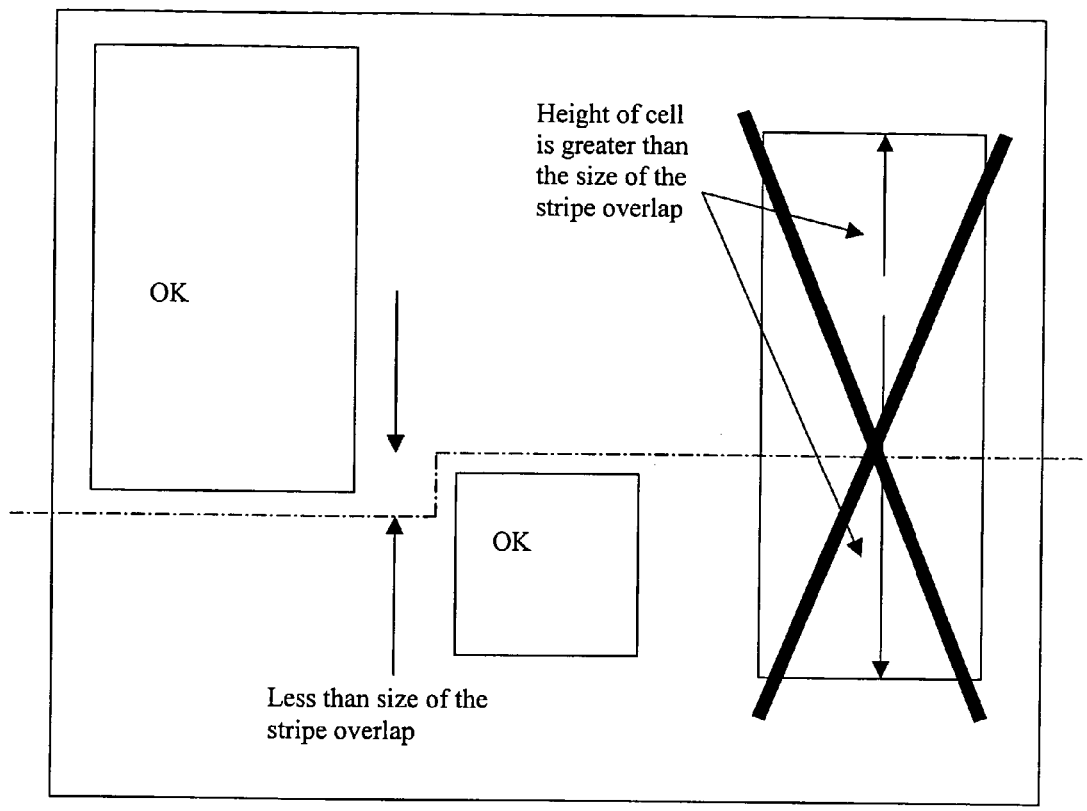
FIG. 5 shows an example of a block based floorplanner to allow a user to consider context information to decide the locations of blocks for increasing the speed of mask writing.

Similarly, a user (in a block based floorplanner for example) may decide the locations of the blocks, as shown in FIG. 5, so that the faster mask writing techniques can be used. The user may do so by placing entire polygons, or critical portions of polygons, within a stripe. An automated process may also be used to shift the design features based on an analysis of context information so that the features, or the important portions of the features, avoid crossing the stripe boundaries. In this example, a large cell (higher than a stripe size) should not be sensitive to the worse case overlap, because the cell overlaps the boundary.

In an embodiment of this process, the importance of design elements can be associated with attributes of features, rather than with features themselves. For example, in some cases, the width is the most important, some matching is most important, some area is most important, or some edge placement. The assignment of features to stripes thus may be driven by which attributes of each figure are considered important (rather than whether the figure itself is important), and possible improvement of mask writing speed. For example, a figure where the width is an important attribute, or the most important for example, may be written entirely in one stripe, as well as two figures that are supposed to match may both be written in the same stripe. If area is an important concern, then assignment to stripes may not matter and the assignment of features to stripes may be done to optimize mask writing speed.

Figure 6:
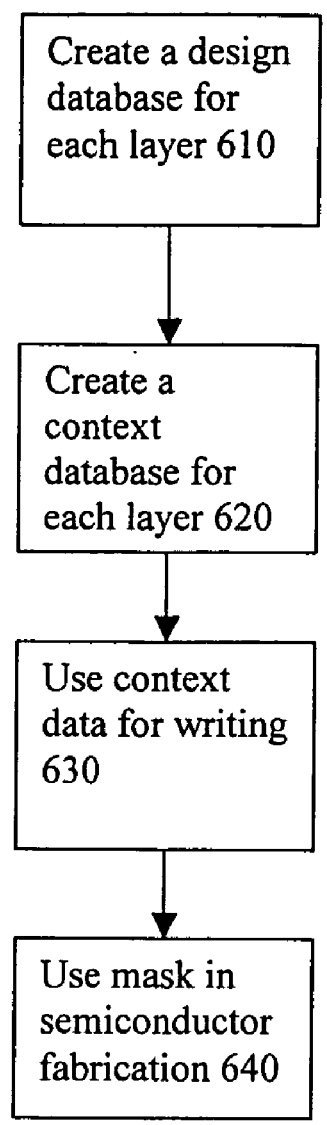
FIG. 6 shows an example of a process of mask making and chip fabrication using context information.

FIG. 6 shows an example of a process of mask making and chip fabrication using context information. A design database is created that contains information for each layer of the IC design, 610. A context specific mask writing database for each layer is created, 620. The mask writing database includes information for each feature of the layer, and information about the context of the feature produced from the circuit design. A mask writing machine uses the context specific data to generate the mask, 630. The mask is then used in semiconductor fabrication, 640.

Figure 7:
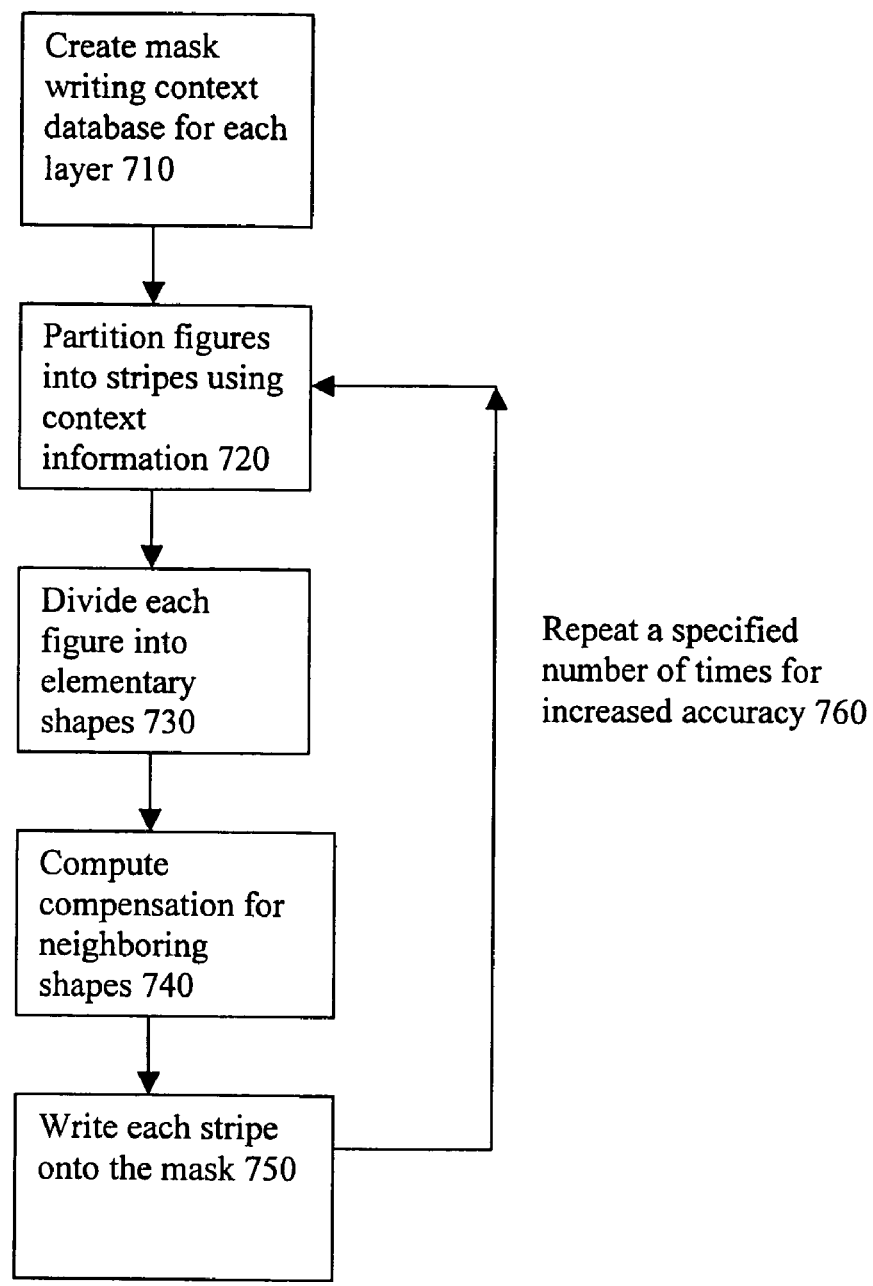
FIG. 7 shows an example of using information from the context specific mask writing database for writing one layer to a mask with one or more passes.

FIG. 7 shows an example of using information from the context specific mask writing database for writing one layer to a mask with one or more passes. The context specific mask writing database is generated, 710. Data from the context specific mask writing database is used to partition the layer into stripes based on the context information of the features for the layer, 720. Each feature may be divided into elementary shapes, 730. A compensation factor may be computed for neighboring shapes, 740. Each stripe is written onto the mask, 750. The process may return to 720 if multiple passes to increase accuracy are desired, 760.

Figure 8:
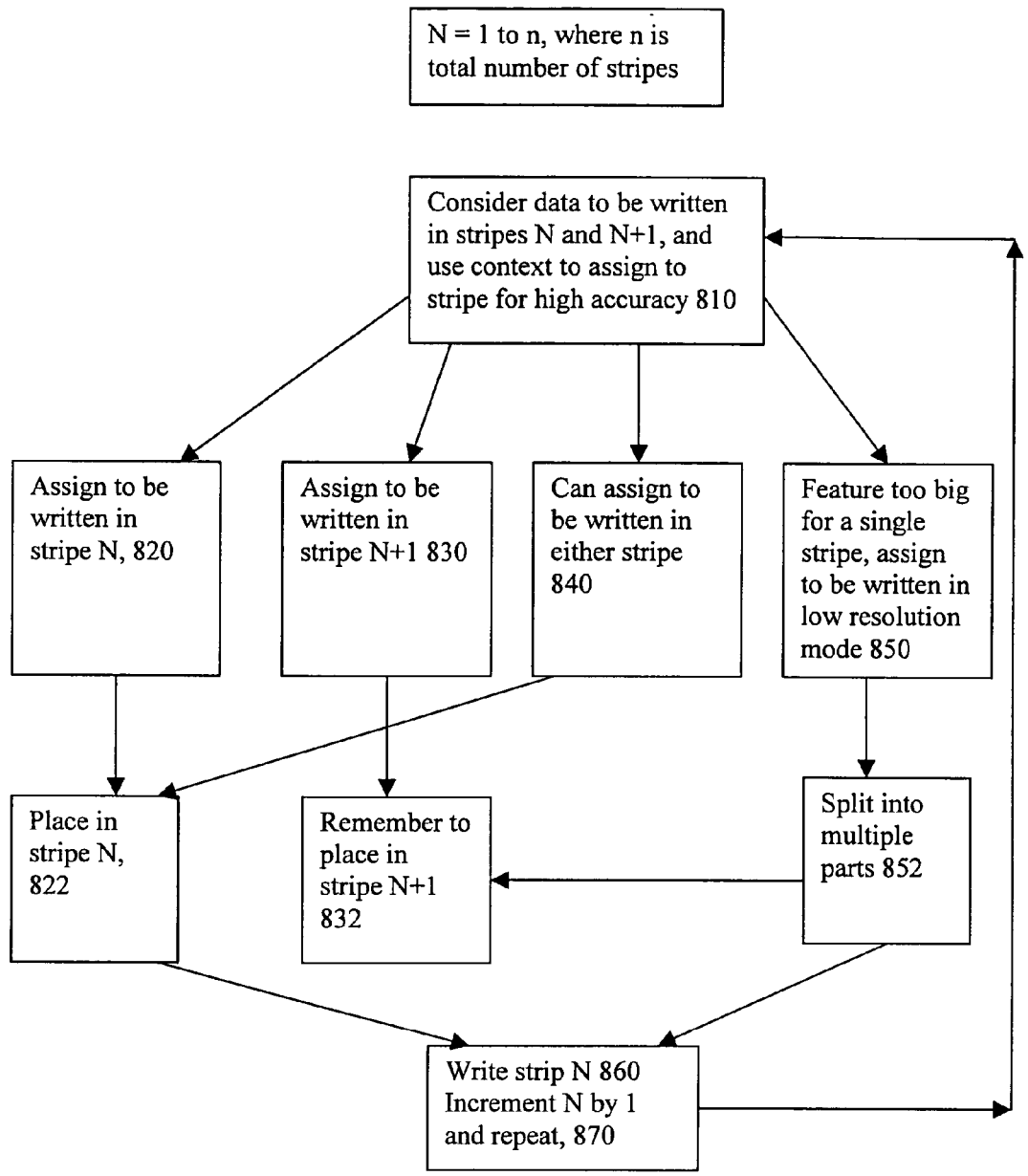
FIG. 8 shows an example of using context specific data to partition the layer into stripes, and to assign the polygons of the layer to a corresponding stripe.

FIG. 8 shows an example of using context specific data to partition the layer into stripes, and to assign the polygons of the layer to a corresponding stripe. Data for polygons to be written in neighboring stripes N and N+1 is considered, 810. Each polygon in the neighboring stripes is assigned to one or both of the stripes by using the context specific data for the polygon. The stripe that can produce a more accurate polygon on the mask during writing is selected as the assigned stripe for the polygon. The polygon may be assigned to stripe N, 820. The polygon is placed in stripe N, 822. The polygon may be assigned to stripe N+1, 830. The polygon is placed in stripe N+1, 832. If the polygon may be placed in either stripe, 840, the polygon may be placed in stripe N, 822, or placed in stripe N+1, 832. If the polygon is too large to be contained in a single stripe, 850, the polygon is divided into multiple portions, 852, and portions are assigned both stripes, N and N+1. The divided polygon may be written with less resolution than a polygon that is contained within a stripe. The polygons of each stripe are written to the mask, 860. The next stripe may then be considered by returning to 810 and incrementing N by 1. The process may continue until each stripe has been considered and written to the mask.

Figure 9:
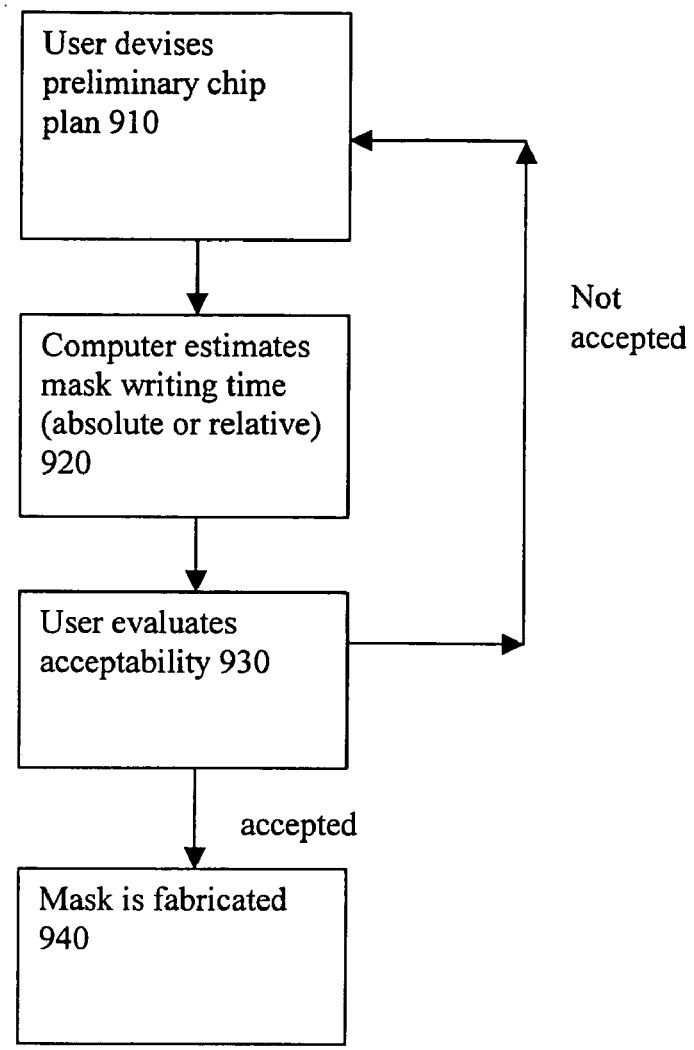
FIG. 9 shows an example of using context specific information to provide a user with a desired speed for writing the mask.

FIG. 9 shows an example of using context specific information to provide a user with a desired speed for writing the mask. A user devises a preliminary mask writing plan, 910. When devising the plan, the user can assign certain features to certain stripes based on context information of the features. A processor then calculates a writing time for the given plan, 920. The user then accepts or rejects the plan based on the calculated writing time, 930. If the plan is accepted, the mask is fabricated, 940. If the plan is rejected, the process returns to 910 to allow the user to change the stripe assignments of the features, which produces a new writing time. The process may be repeated until the user accepts a plan.

Figure 10:
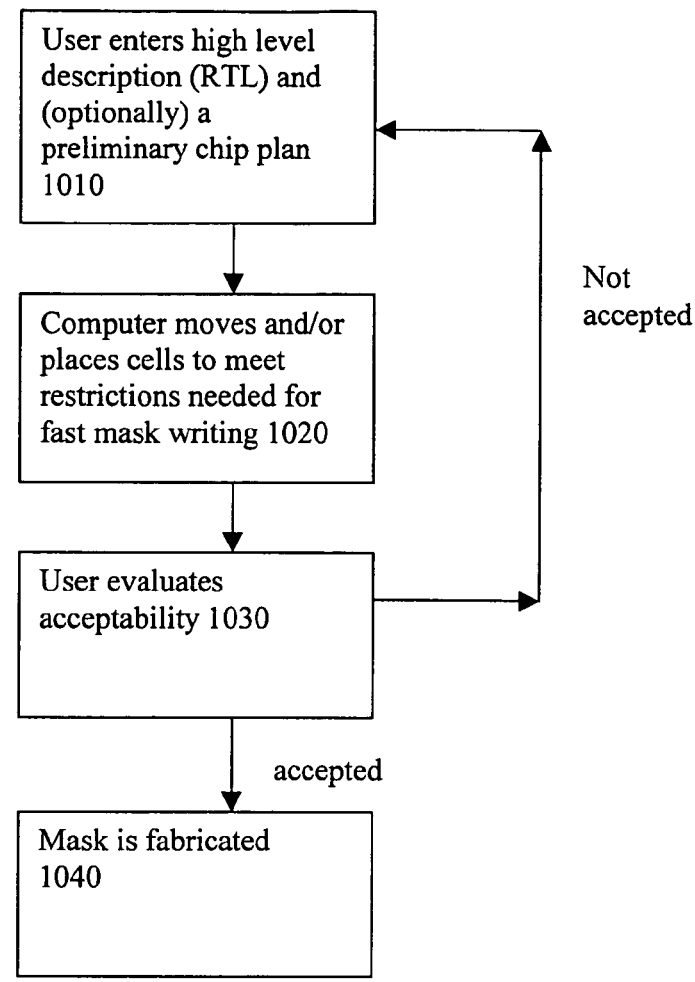
FIG. 10 shows an example of an automatic procedure for using context information to determine a writing plan to write a mask.

FIG. 10 shows an example of an automatic procedure for using context information to determine a writing plan to write a mask for a user within an acceptable amount of time. The user enters a high level description of the circuit design, such as an RTL description for example, 1010. The user may also enter a preliminary plan for writing the mask. A computer processor then moves or places cells of the design to produce a plan for a fast writing process, 1020. The user determines whether the writing time of the plan is acceptable, 1030. If the plan is acceptable, the mask is fabricated, 1040. If the writing process for the proposed plan is greater than a limit acceptable to the user, the process to determine the writing plan returns to 1010.

FIGS. 11A through 11G show examples of information provided by considering design features with respect to the context of the design. This context information, which may be used to identify critical features, is significantly more useful than labeling each design feature with a tag that provides no indication as to why or how the feature is critical. The element is a via, represented as a larger square on a first layer and a smaller square on a second layer. The context of the via can be used to identify which features of the via are critical. A fabrication rule may state that the via is completely enclosed by the first layer, even in the presence of process uncertainty. The smaller square on the second layer may be in different locations relative to the larger square on the first layer.

Figure 11A:
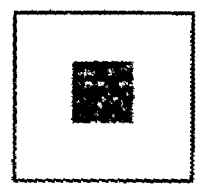
FIGS. 11A through 11G show examples of information provided by considering design features with respect to the context of the design.
Figure 11B:
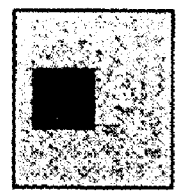
Figure 11C:
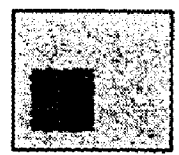
Figure 11D:
Figure 11E:
Figure 11F:
Figure 11G:
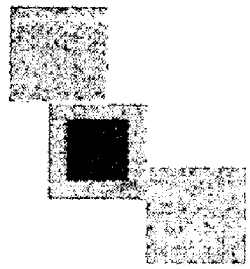

For the embodiment of FIG. 11A, the placements of the sides are not critical. As shown in FIG. 11B, one side is critical. In FIGS. 11C and 11D, two sides are critical. FIG. 11E shows an example having three sides that are critical. In FIG. 11F, placement of all four sides is critical. In FIG. 11G, portions of some edges are critical and others are not.

The vias themselves, and some of the constraints (such as minimum area for example), are identical in FIGS. 11A through 11F. However, whether the edge placement is critical (and hence worth the cost of providing increased accuracy during the mask writing, or is rejected as a defect during the mask inspection), may not be determined from the fact that the figure represents a via, or by marking the via as critical. Rather, the context information may be used to determine the critical and non-critical features of the via. In this case, the context information could be used to individually mark each edge as critical or non-critical.

The context based approach to writing provides a system for writing masks faster than conventional multi-pass solutions, which provide same accuracy to each polygon written to the masks, even though some polygons can be written with a lower accuracy than others.

The context based approach allows writing at higher speeds without sacrificing accuracy in the places where it is desired. In contrast to traditional approaches, which do not allow selected features (e.g., those selected as non-critical) to be written with faster but less accurate methods, and also do not take into account why a feature is critical, the mask writing process that uses context information provides optimizations for both writing speed and writing accuracy simultaneously. For example, one unified procedure may be used for determining the writing speed, where the writing order within that procedure is arranged to meet the user's desired writing accuracy, unlike traditional methods which require different writing procedures for different elements, such as critical and non-critical elements for example.

This context based approach allows the mask writing to take into account relationships between shapes as well as the characteristics of the shapes themselves using design context, such as the geometrical neighborhood of shapes and the electrical requirements of the resulting chip. This approach allows the user to make tradeoffs between mask fabrication decisions and other concerns such as electrical or physical tolerances, time to market, mask cost, and yield. Previous approaches only did very crude analysis, did not help the user in making tradeoffs, and only allowed these decisions at very high levels of granularity (for example, either the whole chip is written at high precision, or it is not).

Also, the user, when creating a floorplan or a chip layout, may assess if any features have been created that are slow to write, in contrast to previous approaches that do not allow this analysis at either the floor plan or layout level. The user may also constrain or modify the design based on the context information so that the masks can be written more quickly. Previous approaches did not allow the user any visibility into the mask writing speed, nor any control over it.

The context specific mask writing process permits design intent information to be used to decide how accurately each mask feature is reproduced when mask writing occurs. The design intent may also be used in the context specific writing process to improve the speed of writing mask features, as opposed to changing the number of features that need to be written. A context based writing database may be created that stores, along with each feature to be written, the desired accuracy of that feature, and the importance of each geometrical attribute of the feature. A tool that can assess the tradeoffs between physical, circuit, or component attributes and mask fabrication decisions is provided with context specific mask writing.

A floorplanner than can assess a floorplan in terms of how long it will take to write for a desired level of accuracy can be created with the context based writing process. Alternatively, the floorplanner can analyze a layout, and report how accurately each feature can be written for a desired writing speed.

The floorplanner may show graphical lines, which if not crossed by critical features, can allow for faster mask writing. Alternatively, the same lines can be used, and the user may be informed of the accuracy that can be achieved for each feature. For another example, the floorplanner may automatically place at least a subset of the cells such that they are in the correct position for faster mask writing.

The context based writing method can also be used with a mask writing system where the mask is written in separate portions, and the error between the portions is larger then the error within the portion, and an average feature of the mask is smaller than the overlap between portions. These portions may be stripes, squares, non-uniformly sized stripes, or other subsections of the mask, for example.

Additional examples of mask writing processes that are improved using the context based methods disclosed herein are found in co-pending U.S. application Ser. No. 10/620,284, filed Jul. 14, 2003, entitled METHOD AND SYSTEM FOR CONTEXT-SPECIfIC MASK WRITING, which is incorporated herein by reference in its entirety. In addition to mask writing, the context analysis methods disclosed herein may be used to perform mask inspection methods, such as those described in co-pending U.S. application Ser. No. 10/620,285, filed Jul. 14, 2003, entitled METHOD AND SYSTEM FOR CONTEXT-SPECIfIC MASK INSPECTION, which is incorporated herein by reference in its entirety.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

We claim:

1. A method comprising:
   generating an integrated circuit design;
   creating a design database containing design data for a layer of the design;
   creating context information for features of the layer of the design;
   analyzing the context information to identify important attributes of features of the layer of the design;
   partitioning the layer of the design into a plurality of physical regions;
   assigning each feature to one or more of the plurality of physical regions based upon the importance of the attributes of the feature; and
   devising a writing plan to write each feature within the corresponding physical region.

2. The method of claim 1, wherein analyzing the context information to identify important features comprises:
   identifying important attributes of the design; and
   identifying polygons with the important attributes.

3. The method of claim 2, further comprising:
   dividing each important polygon into a plurality of shapes; and
   for each polygon, identifying shapes with important attributes.

4. The method of claim 3, wherein assigning each feature to one physical region comprises assigning each shape to one or more regions, consistent with the attributes of each shape.

5. The method of claim 1, wherein analyzing the context information to identify important features comprises:
   displaying the design data for the layer of the design to a user;
   displaying the context information for the features of the layer of the design to the user;
   receiving an identification of the important attributes of features from the user.

6. The method of claim 5, wherein assigning each important feature to one of the physical regions comprises receiving an assignment of the feature to one physical region from the user.

7. The method of claim 6, further comprising calculating a writing time for the writing plan.

8. The method of claim 7, further comprising accepting or rejecting the writing plan based on the writing time.

9. The method of claim 1, wherein analyzing the context information to identify important features comprises automatically locating important features of the layer of the design based on the context information.

10. The method of claim 9, wherein partitioning the layer of the design into a plurality of physical regions comprises automatically generating partitions so that each important feature is within one of the physical regions.

11. The method of claim 10, further comprising calculating a writing time for the writing plan.

12. The method of claim 11, further comprising accepting or rejecting the writing plan based on the writing time.

13. The method of claim 1, wherein the physical regions are stripes.

14. A system comprising:
means for generating an integrated circuit design;
means for creating a design database containing design data for a layer of the design;
means for creating context information for features of the layer of the design;
means for analyzing the context information to identify the important attributes of features of the layer of the design;
means for partitioning the layer of the design into a plurality of physical regions;
means for assigning each feature to one or more of the plurality of physical regions, based upon its attributes; and
means for devising a writing plan to write each important feature within the corresponding physical region.

15. The system of claim 14, wherein said means for analyzing the context information to identify important features comprises:
means for identifying important attributes of the design; and
means for identifying polygons with the important attributes.

16. The system of claim 15, further comprising:
means for dividing each important polygon into a plurality of shapes; and
means for identifying shapes with the important attributes for each polygon.

17. The system of claim 16, wherein said means for assigning each important feature to one physical region comprises means for assigning each shape with the important attributes to one physical region.

18. The system of claim 14, wherein said means for analyzing the context information to identify important features comprises:
means for displaying the design data for the layer of the design to a user;
means for displaying the context information for the features of the layer of the design to the user; and
means for receiving an identification of the important features from the user.

19. The system of claim 18, wherein said means for assigning each important feature to one of the physical regions comprises means for receiving an assignment of the feature to one physical region from the user.

20. The system of claim 19, further comprising means for calculating a writing time for the writing plan.

21. The system of claim 20, further comprising means for accepting or rejecting the writing plan based on the writing time.

22. The system of claim 14, wherein said means for analyzing the context information to identify important features comprises means for automatically locating important features of the layer of the design based on the context information.

23. The system of claim 22, wherein said means for partitioning the layer into a plurality of physical regions comprises means for automatically generating partitions so that each important feature is within one of the physical regions.

24. The system of claim 22, further comprising means for calculating a writing time for the writing plan.

25. The system of claim 24, further comprising means for accepting or rejecting the writing plan based on the writing time.

26. The system of claim 14, wherein the physical regions are stripes.

27. A method comprising:
generating an integrated circuit design data having a plurality of polygons;
determining a context information from the integrated circuit design data;
analyzing features of the design data with the context information to distinguish important attributes of features from unimportant attributes and features; and
adjusting a mask writing process to write each feature with an accuracy commensurate with the importance of the attributes of that feature.

28. The method of claim 27 wherein the context information for the design features comprises information for neighboring geometries, electrical intent of the features, timing of the intended circuit, redundant features, and relationships of a given feature to neighboring features.

29. The method of claim 27 further comprising identifying an importance of a given feature, or of a given attribute of a given feature, relative to other features of the design based on context information.

30. The method of claim 29, wherein the relative importance is identified with context information comprising a reason for locating the feature in a particular place within the design, an intended use of the feature within the design, and electrical requirements of the feature within the design.

31. A system comprising:
means for generating an integrated circuit design data having a plurality of polygons;
means for determining a context information from the integrated circuit design data;
means for analyzing features of the design data with the context information to distinguish important attributes of features from unimportant attributes; and
means for adjusting a mask writing process to write each feature with an accuracy commensurate with the importance of the attributes of that feature.

32. The system of claim 31 wherein the context information for the design features comprises information for neighboring geometries, electrical intent of the features, timing of the intended circuit, redundant features, and relationships of a given feature to neighboring features.

33. The system of claim 31 further comprising means for identifying an importance of a given feature relative to other features of the design based on context information.

34. The system of claim 33, wherein the relative importance is identified with context information comprising a reason for locating the feature in a particular place within the design, an intended use of the feature within the design, and electrical requirements of the feature within the design.

* * * * *